(12) United States Patent
Tsai

(10) Patent No.: US 8,652,943 B2
(45) Date of Patent: Feb. 18, 2014

(54) METHOD OF PROCESSING SUBSTRATE

(75) Inventor: Tsung-Hsun Tsai, Chiayi County (TW)

(73) Assignee: United Microelectronics Corp., Hsinchu (TW)

( * ) Notice: Subject to any disclaimer, the term of this patent is extended or adjusted under 35 U.S.C. 154(b) by 19 days.

(21) Appl. No.: 13/473,699

(22) Filed: May 17, 2012

(65) Prior Publication Data

US 2013/0309845 A1  Nov. 21, 2013

(51) Int. Cl.
H01L 21/322 (2006.01)

(52) U.S. Cl.
USPC ............................. 438/476; 438/906

(58) Field of Classification Search
USPC ................................. 438/476, 906
See application file for complete search history.

(56) References Cited

U.S. PATENT DOCUMENTS

| | | | |
|---|---|---|---|
| 7,364,626 B2 * | 4/2008 | Hirose et al. | 134/2 |
| 2006/0249182 A1 * | 11/2006 | Hayamizu et al. | 134/34 |
| 2007/0113872 A1 * | 5/2007 | Uchida et al. | 134/26 |
| 2007/0125405 A1 | 6/2007 | Sekiguchi et al. | |
| 2010/0286014 A1 * | 11/2010 | Barnes | 510/175 |
| 2011/0214697 A1 * | 9/2011 | Archer | 134/28 |
| 2011/0279900 A1 * | 11/2011 | Wang et al. | 359/576 |

* cited by examiner

*Primary Examiner* — Luan C Thai
(74) *Attorney, Agent, or Firm* — WPAT, PC; Justin King

(57) ABSTRACT

A method of processing a substrate is provided. The method includes providing a substrate, performing a device forming process on the substrate, and cleaning the substrate. The step of cleaning the substrate includes cleaning the substrate with an atomic spray and rinsing the substrate with deionized water.

30 Claims, 2 Drawing Sheets

METHOD OF PROCESSING SUBSTRATE

BACKGROUND OF THE INVENTION

1. Field of the Invention

The disclosure relates in general to a method of processing a substrate, and more particularly to a method of processing a substrate, which method prevents the substrate from being damaged by electric charge volcano on the surface of the substrate.

2. Description of the Related Art

In recent years, the structures of semiconductors have been changed continuously, and the steps of manufacturing semiconductors have been increased correspondingly, which may cause the process yields of semiconductor devices to drop undesirably. In particular, when there are defects on the surface of a substrate or a device, the yields of the subsequent manufacturing processes may drop easily.

As such, it is desirable to decrease the defects on the surface of a semiconductor substrate or a semiconductor device in semiconductor manufacturing processes, hence to improve the process yields of semiconductor manufacturing processes.

SUMMARY OF THE INVENTION

The invention is directed to a method of processing a substrate. By cleaning the substrate with an atomic spray followed by rinsing the substrate with deionized water, the electric charges can be effectively removed from the surface of the substrate to prevent the electric charge volcano from occurring on the surface of the substrate.

According to one embodiment of the present disclosure, a method of processing a substrate is provided. The method includes providing a substrate, performing a device forming process on the substrate, and cleaning the substrate. The step of cleaning the substrate includes cleaning the substrate with an atomic spray and rinsing the substrate with deionized water after the substrate is cleaned with the atomic spray.

According to another embodiment of the present disclosure, a method of processing a substrate is provided. The method includes providing a substrate, performing a device forming process on the substrate, cleaning the substrate with an atomic spray, and cleaning the substrate with a chemical solution after the substrate is cleaned with the atomic spray.

According to a further embodiment of the present disclosure, a method of processing a substrate is provided. The method includes providing a substrate, cleaning the substrate with an atomic spray, and cleaning the substrate with deionized water after the substrate is cleaned with the atomic spray.

The disclosure will become apparent from the following detailed description of the preferred but non-limiting embodiments. The following description is made with reference to the accompanying drawings.

DETAILED DESCRIPTION OF THE INVENTION

Figure 1A:
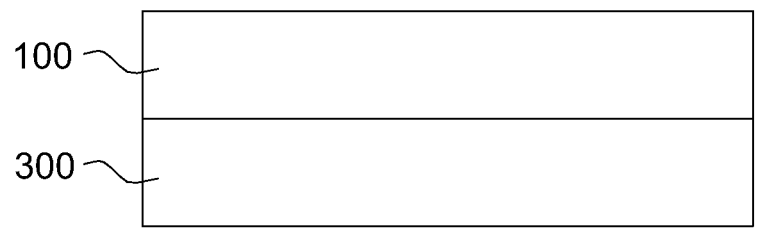
FIG. 1A-FIG. 1C illustrate a method of processing a substrate according to the embodiment of the disclosure.

In the embodiment of the present disclosure, by cleaning the substrate with an atomic spray followed by rinsing the substrate with deionized water, the electric charges can be effectively removed from the surface of the substrate to prevent the electric charge volcano from occurring on the surface of the substrate. The embodiment is described in details with reference to the accompanying drawings. The procedures and details of the formation method and the structure of the embodiment are for exemplification only, not for limiting the scope of protection of the disclosure. Moreover, secondary elements are omitted in the disclosure of the embodiment for highlighting the technical features of the disclosure. The identical elements of the embodiment are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Figure 1B:
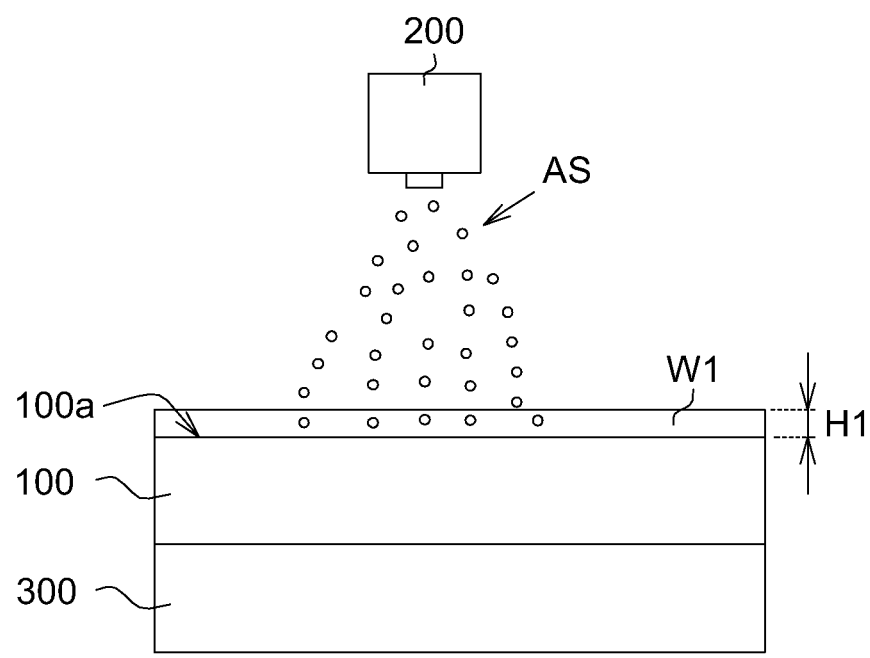
Figure 1C:
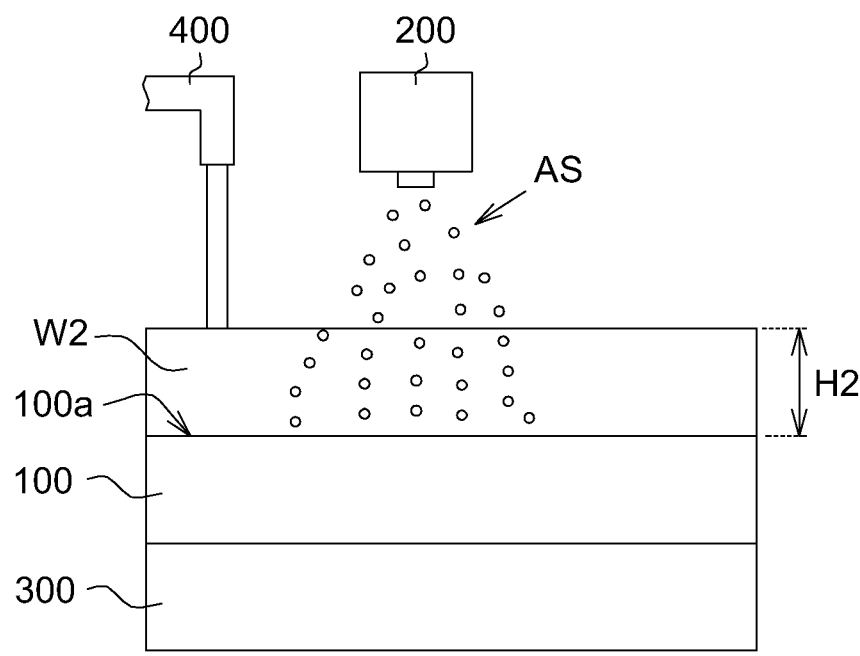

Please refer to FIG. 1A-FIG. 1C. FIG. 1A-FIG. 1C illustrate a method of processing a substrate according to the embodiment of the disclosure.

As shown in FIG. 1A, a substrate 100 is provided.

In one embodiment, a device forming process can be optionally performed on the substrate 100. In the embodiment, the device forming process performed on the substrate 100 could be one or more of an ion implantation process, an etching process, formation of a material layer, a lithography process, and a stripping process. In the embodiment, the ion implantation process includes, for example, coating a photoresist layer (not shown) on the substrate, implanting ions (not shown) in the substrate, and removing the photoresist layer. The etching process is such as a plasma etching process. The stripping process is, for example, stripping a photoresist with an oxygen plasma.

As shown in FIG. 1B, the substrate 100 is cleaned with an atomic spray AS. In one embodiment, the atomic spray AS is provided from, such as, an atomic spray nozzle 200 to clean the substrate 100.

In one embodiment, the atomic spray AS includes water and nitrogen gas. In the embodiment, the atomic spray AS is composed of, for example, water and nitrogen gas. For examples, water has a flow rate of 15-300 $cm^3$/min (standard cubic centimeter per minute, sccm), and nitrogen has a flow rate of larger than 0 $cm^3$/min to 100 $cm^3$/min.

Normally, electric charges may occur and accumulate on the surface 100a of the substrate 100 after manufacturing processes are carried out on the substrate 100. The manufacturing processes that could induce electric charge accumulation are, such as, an ion implantation process, a plasma etching process, a plasma assisted chemical vapor deposition, and etc. but not limited hereto. Electric current is applied in the ion implantation process, and plasma is applied in the plasma etching process as well as the plasma assisted chemical vapor deposition. Therefore, the above-mentioned processes may induce electric charge accumulation on the surface 100a of the substrate 100. In the embodiment, the atomic spray AS has many tiny water-mist drops. When the substrate 100 is cleaned with the atomic spray AS, many tiny water-mist drops are in contact with the surface 100a of the substrate 100 at about the same time and transfer the electric charges on the surface 100a of the substrate 100 away through those contact points, hence the surface 100a of the substrate 100 is not damaged by a large amount of electric charges occurring at a single point. In other words, when the substrate 100 is cleaned with the atomic spray AS, the electric charge volcano phenomenon, where a large amount of electric charges occurring at a single point caused by a single water flow in contact with the surface 100a of the substrate 100 when the substrate 100 is washed with a single water flow, which causes the surface 100a of the substrate 100 to be damaged, would not happen. For example, when there are patterned metal lines on the surface 100a of the substrate 100, by cleaning the substrate 100 with the atomic spray AS, many tiny water-mist drops transfer the electric charges on the surface 100a of the substrate 100 away through those contact points, hence the patterned metal lines on the surface 100a of the substrate 100 are not melted and damaged by the electric charge volcano. In the embodiment, when the substrate 100 is cleaned with the atomic spray AS, a water layer W1 is formed on the surface 100a of the substrate 100, and the water layer W1 has a height H1.

Besides, cleaning the substrate 100 with the atomic spray AS can increase the humidity inside the reaction chamber where the substrate is located, which is advantageous to transfer the electric charges on the surface 100a of the substrate 100 away and prevent the surface 100a of the substrate 100 from being damaged by the electric charge volcano.

In the embodiment, cleaning the substrate 100 with the atomic spray AS can be carried in many ways. For example, the relative position of the atomic spray nozzle 200 to the surface 100a of the substrate 100 can be fixed. As such, the atomic spray AS is applied on a fixed position on the surface 100a of the substrate 100, such as the center of the surface 100a of the substrate 100 or the peripheral of the surface 100a of the substrate 100. Further, the atomic spray nozzle 200 can be aligned to the center of the surface 100a of the substrate 100 followed by starting to apply the atomic spray AS on the center of the surface 100a of the substrate 100. And then, the atomic spray nozzle 200 is moved along the radius from the center to the peripheral of the surface 100a of the substrate 100, and the atomic spray AS is applied on the surface 100a of the substrate 100, simultaneously. The above process can be repeated for several times. In the embodiment, when cleaning the substrate 100 with the atomic spray AS, the atomic spray nozzle 200 can be moved independently, the substrate 100 can be moved independently, or both the atomic spray nozzle 200 and the substrate 100 can be moved simultaneously, to change the relative position of the atomic spray nozzle 200 to the substrate 100. Besides, a plurality of atomic spray nozzles can be utilized simultaneously to provide the atomic spray AS on many position on the surface 100a of the substrate 100 to clean the substrate 100.

In the embodiment, as shown in FIG. 1A, after providing the substrate 100 and prior to cleaning the substrate 100 with the atomic spray AS, the substrate 100 can be optionally mounted on a rotary disc 300, and the rotary disc 300 can be rotated at a speed of 30-200 rpm (revolution per minute). In one embodiment, the rotary disc 300 is rotated for about 1-3 seconds before the substrate 100 is cleaned with the atomic spray AS. In one embodiment, the rotary disc 300 is continuously rotated while the substrate 100 is subjected to a cleaning step.

As shown in FIG. 1C, the substrate 100 is rinsed with deionized water. In one embodiment, the deionized water is provided from, such as, a liquid discharge device 400 to rinse the substrate 100. The deionized water is provided as, such as, a single water flow to rinse the substrate 100. In one embodiment, the step of rotating the rotary disc 300 and the step of rinsing the substrate 100 with deionized water are performed simultaneously.

In one embodiment, when the substrate 100 is rinsed with deionized water, the deionized water has a flow rate of, for example, 500-2000 cm$^3$/min, or preferably 1500 cm$^3$/min, approximately. In the embodiment, when the substrate 100 is rinsed with deionized water, a water layer W2 is formed on the surface 100a of the substrate 100, and the water layer W2 has a height H2. The height H2 of the water layer W2 is, for example, larger than the height H1 of the water layer W1.

In the embodiments, the step of rinsing the substrate 100 with deionized water may start after the step of cleaning the substrate 100 with the atomic spray AS has started for a period of time. Alternatively, the substrate 100 can be rinsed with deionized water and cleaned with the atomic spray AS simultaneously.

In one embodiment, the step of rinsing the substrate 100 with deionized water may start after the step of cleaning the substrate 100 with the atomic spray AS has started for about 10 microseconds to 1 minute. In the embodiment, the substrate 100 can further be cleaned with the atomic spray AS continuously when cleaned with deionized water. That is to say, the substrate 100 is cleaned with the atomic spray AS at first, and in about 10 microseconds to 1 minute, the substrate 100 is then rinsed with deionized water while still cleaned with the atomic spray AS continuously. In other words, after the step of cleaning the substrate 100 with the atomic spray AS starts for about 10 microseconds to 1 minute, the substrate 100 is rinsed with deionized water and cleaned with the atomic spray AS simultaneously.

As shown in FIG. 1C, after the substrate 100 is cleaned with the atomic spray AS, the substrate 100 is then cleaned with a chemical solution. In one embodiment, the chemical solution is provided from, such as, the liquid discharge device 400 to rinse the substrate 100. That is to say, the liquid discharge device 400 can provide deionized water and the chemical solution in different steps, respectively. In an alternative embodiment, the chemical solution is provided from, such as, an independent chemical solution discharge device (not shown) to rinse the substrate 100. That is to say, deionized water and the chemical solution are provided from the liquid discharge device 400 and the independent chemical solution discharge device, respectively. The chemical solution is provided as, such as, a single solution flow to rinse the substrate 100.

In one embodiment, the step of cleaning the substrate 100 with the chemical solution may start, for example, after the step of cleaning the substrate 100 with the atomic spray AS has started. In an alternative embodiment, the step of cleaning the substrate 100 with the chemical solution may start, for example, after the step of rinsing the substrate 100 with deionized water has started. In one embodiment, the step of rotating the rotary disc 300 and the step of cleaning the substrate 100 with the chemical solution are performed simultaneously.

In one embodiment, the step of cleaning the substrate 100 with the chemical solution may start after the step of cleaning the substrate 100 with the atomic spray AS has started for about 10 microseconds to 1 minute. In the embodiment, the substrate 100 can further be cleaned with the atomic spray AS continuously when cleaned with the chemical solution. That is to say, the substrate 100 is cleaned with the atomic spray AS at first, and in about 10 microseconds to 1 minute, the substrate 100 is then cleaned with the chemical solution while still cleaned with the atomic spray AS continuously. In other words, after the step of cleaning the substrate 100 with the atomic spray AS starts for about 10 microseconds to 1 minute, the substrate 100 is cleaned with the chemical solution and the atomic spray AS simultaneously.

The substrate 100 can be any to-be-treated substrate. In one embodiment, performing the device forming process on the substrate 100 can be prior to cleaning the substrate 100. As such, the substrate 100 can be a substrate that has been treated with an ion implantation process, an etching process, a lithography process, or a stripping process, or a substrate that has a material layer formed thereon. In another embodiment, the step of performing the device forming process on the substrate 100 can be after the step of cleaning the substrate 100. As such, the substrate 100 can be a substrate that has not been treated with an ion implantation process, an etching process, a lithography process, or a stripping process, or a substrate that does not have any device formed thereon.

Figure 2:
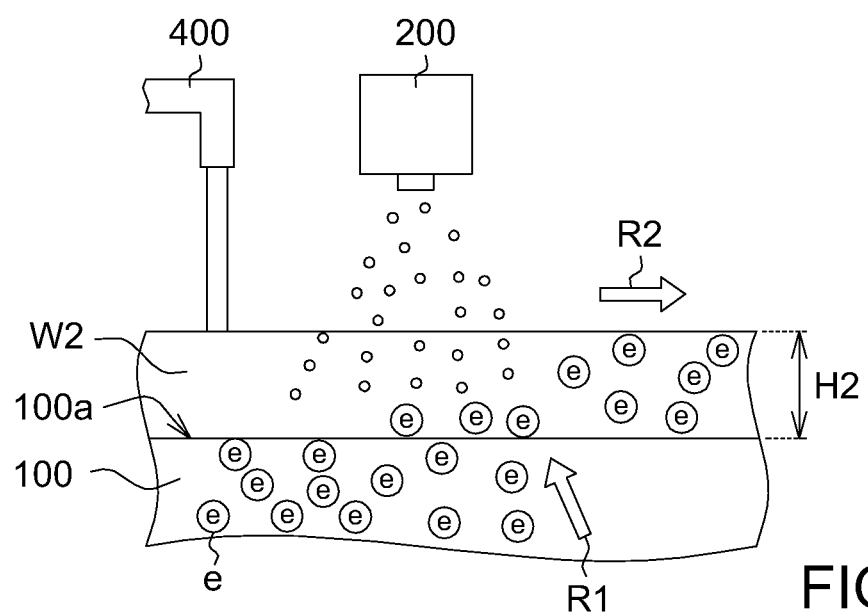
FIG. 2 shows a schematic diagram of electric charges transferring away from the substrate according to the embodiment of the disclosure.

As shown in FIG. 2, FIG. 2 shows a schematic diagram of electric charges transferring away from the substrate according to the embodiment of the disclosure. When the substrate 100 is cleaned with the atomic spray AS, many tiny water-mist drops are in contact with the surface 100a of the substrate 100 at many contact points on the surface 100a of the substrate 100, and the electric charges e on the surface 100a of the substrate 100 are transferred away through those contact points. As shown in FIG. 2, the electric charges e are moving along the direction R1 towards the contact points between the tiny water-mist drops and the surface 100a of the substrate 100 and transferred away. While the substrate 100 is continuously cleaned with the atomic spray AS followed by rinsed with deionized water, the water layer W2 having the height H2 is formed on the surface 100a of the substrate 100. The height H2 is high enough for the electric charges e, which are transferred towards the surface 100a of the substrate 100 by the atomic spray AS, to be removed by deionized water. As shown in FIG. 2, the electric charges e are transferred away in the water layer W2 along the direction R2. As such, the electric charges e can be effectively removed from the surface 100a of the substrate 100 to prevent the electric charge volcano from occurring on the surface 100a of the substrate 100, hence the surface 100a of the substrate 100 is not damaged by the electric charge volcano. Similarly, by cleaning the substrate 100 with the atomic spray AS followed by rinsing the substrate 100 with the chemical solution, the effect of preventing the surface 100a of the substrate 100 from being damaged by the electric charge volcano can be achieved as well.

According to the aforementioned methods of processing a substrate of the embodiments, by cleaning the substrate with an atomic spray, the surface of the substrate is not damaged by a large amount of electric charges occurring at a single point on the substrate. Further, by cleaning the substrate with the atomic spray followed by rinsing the substrate with deionized water while the substrate is continuously cleaned with the atomic spray, the electric charges on the surface of the substrate can be removed effectively without initiating electric charge volcano.

While the invention has been described by way of example and in terms of the exemplary embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of processing a substrate, comprising:
   providing a substrate;
   performing a device forming process on the substrate; and
   cleaning the substrate, comprising:
   cleaning the substrate with an atomic spray;
   rinsing the substrate with deionized water; and
   cleaning the substrate with a chemical solution after cleaning the substrate with the atomic spray has started.

2. The method of processing the substrate according to claim 1, wherein the atomic spray comprises water and nitrogen gas.

3. The method of processing the substrate according to claim 2, wherein when cleaning the substrate with the atomic spray, the water has a first flow rate of 15-300 cm$^3$/min (standard cubic centimeter per minute, sccm), and the nitrogen has a second flow rate of larger than 0 cm$^3$/min to 100 cm$^3$/min.

4. The method of processing the substrate according to claim 1, wherein when rinsing the substrate with deionized water, the deionized water has a third flow rate of 1500 cm$^3$/min, approximately.

5. The method of processing the substrate according to claim 1, wherein rinsing the substrate with deionized water is performed in about 10 microseconds (μs) to 1 minute after cleaning the substrate with the atomic spray is performed.

6. The method of processing the substrate according to claim 1, wherein cleaning the substrate with the atomic spray is performed continuously when rinsing the substrate with deionized water is performed.

7. The method of processing the substrate according to claim 1, wherein rinsing the substrate with deionized water and cleaning the substrate with the atomic spray are performed simultaneously.

8. The method of processing the substrate according to claim 1, prior to cleaning the substrate, further comprising:
   mounting the substrate on a rotary disc; and
   rotating the rotary disc at a speed of 30-200 rpm (revolution per minute).

9. The method of processing the substrate according to claim 8, wherein performing rotating the rotary disc is about 1-3 seconds prior to performing cleaning the substrate with the atomic spray.

10. The method of processing the substrate according to claim 8, wherein rotating the rotary disc is continuously performed when cleaning the substrate is performed.

11. The method of processing the substrate according to claim 1, wherein the device forming process comprises at least one of an ion implantation process, an etching process, formation of a material layer, a lithography process, and a stripping process.

12. The method of processing the substrate according to claim 11, wherein the ion implantation process comprises:
    coating a photoresist layer on the substrate;
    implanting ions in the substrate; and
    removing the photoresist layer.

13. The method of processing the substrate according to claim 1, wherein performing the device forming process is prior to cleaning the substrate.

14. The method of processing the substrate according to claim 1, wherein performing the device forming process is after cleaning the substrate.

15. A method of processing a substrate, comprising:
    providing a substrate;
    performing a device forming process on the substrate;
    cleaning the substrate with an atomic spray; and
    cleaning the substrate with a chemical solution after cleaning the substrate with the atomic spray has started.

16. The method of processing the substrate according to claim 15, wherein the atomic spray comprises water and nitrogen gas.

17. The method of processing the substrate according to claim 16, wherein when cleaning the substrate with the atomic spray, the water has a first flow rate of 15-300 cm$^3$/min, and the nitrogen has a second flow rate of 0-100 cm$^3$/min.

18. The method of processing the substrate according to claim 15, wherein cleaning the substrate with the chemical solution is performed after cleaning the substrate with the atomic spray is performed.

19. The method of processing the substrate according to claim 15, prior to cleaning the substrate with the atomic spray, further comprising:
   mounting the substrate on a rotary disc; and
   rotating the rotary disc at a speed of 30-200 rpm.

20. The method of processing the substrate according to claim 19, performing rotating the rotary disc is about 1-3 seconds prior to performing cleaning the substrate with the atomic spray, and rotating the rotary disc is continuously performed when cleaning the substrate with the atomic spray is performed.

21. A method of processing a substrate, comprising:
   providing a substrate;
   cleaning the substrate with an atomic spray;
   rinsing the substrate with deionized water; and
   cleaning the substrate with a chemical solution after cleaning the substrate with the atomic spray has started.

22. The method of processing the substrate according to claim 21, wherein the atomic spray comprises water and nitrogen gas.

23. The method of processing the substrate according to claim 22, wherein when cleaning the substrate with the atomic spray, the water has a first flow rate of 15-300 cm$^3$/min (standard cubic centimeter per minute, sccm), and the nitrogen has a second flow rate of larger than 0 cm$^3$/min to 100 cm$^3$/min.

24. The method of processing the substrate according to claim 21, wherein when rinsing the substrate with deionized water, the deionized water has a third flow rate of 1500 cm$^3$/min, approximately.

25. The method of processing the substrate according to claim 21, wherein rinsing the substrate with deionized water is performed in about 10 microseconds (μs) to 1 minute after cleaning the substrate with the atomic spray is performed.

26. The method of processing the substrate according to claim 21, wherein cleaning the substrate with the atomic spray is performed continuously when rinsing the substrate with deionized water is performed.

27. The method of processing the substrate according to claim 21, wherein rinsing the substrate with deionized water and cleaning the substrate with the atomic spray are performed simultaneously.

28. The method of processing the substrate according to claim 21, prior to cleaning the substrate, further comprising:
   mounting the substrate on a rotary disc; and
   rotating the rotary disc at a speed of 30-200 rpm (revolution per minute).

29. The method of processing the substrate according to claim 28, wherein performing rotating the rotary disc is about 1-3 seconds prior to performing cleaning the substrate with the atomic spray.

30. The method of processing the substrate according to claim 28, wherein rotating the rotary disc is continuously performed when cleaning the substrate is performed.

* * * * *